(12) United States Patent
Hoshino et al.

(10) Patent No.: US 10,354,915 B2
(45) Date of Patent: Jul. 16, 2019

(54) ADHESION LAYER FORMING METHOD, ADHESION LAYER FORMING SYSTEM AND RECORDING MEDIUM

(71) Applicant: Tokyo Electron Limited, Tokyo (JP)

(72) Inventors: Tomohisa Hoshino, Nirasaki (JP);
Masato Hamada, Nirasaki (JP);
Takashi Tanaka, Nirasaki (JP);
Yuichiro Inatomi, Nirasaki (JP);
Yusuke Saito, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 203 days.

(21) Appl. No.: 15/077,988

(22) Filed: Mar. 23, 2016

(65) Prior Publication Data

US 2016/0284592 A1  Sep. 29, 2016

(30) Foreign Application Priority Data

Mar. 26, 2015  (JP) ................. 2015-064582

(51) Int. Cl.
| | |
|---|---|
| *B05D 3/12* | (2006.01) |
| *H01L 21/70* | (2006.01) |
| *H01L 21/768* | (2006.01) |
| *H01L 21/67* | (2006.01) |
| *C23C 18/18* | (2006.01) |
| *H01L 21/288* | (2006.01) |
| *B05D 1/00* | (2006.01) |
| *C23C 18/16* | (2006.01) |
| *C23C 18/32* | (2006.01) |

(Continued)

(52) U.S. Cl.
CPC .... *H01L 21/76874* (2013.01); *C23C 18/1893* (2013.01); *H01L 21/288* (2013.01); *H01L 21/67051* (2013.01); *H01L 21/76843* (2013.01); *H01L 21/76873* (2013.01); *H01L 21/76898* (2013.01); *B05D 1/005* (2013.01); *C23C 18/1653* (2013.01); *C23C 18/32* (2013.01); *C23C 18/38* (2013.01); *C23C 18/50* (2013.01)

(58) Field of Classification Search
CPC .............. B05D 1/005; H01L 21/76874; H01L 21/67051; H01L 21/6715; H01L 21/76898; H01L 21/76873; C23C 18/1893; C23C 18/1653
USPC ......................................................... 427/240
See application file for complete search history.

(56) References Cited

U.S. PATENT DOCUMENTS 5,066,616 A * 11/1991 Gordon ................... G03F 7/162
148/DIG. 137
5,939,139 A * 8/1999 Fujimoto ................ B05C 11/08
118/52

(Continued)

FOREIGN PATENT DOCUMENTS

| JP | 2005-350747 A | 12/2005 |
|---|---|---|
| JP | 2006-169564 A | 6/2006 |

(Continued)

*Primary Examiner* — Kirsten Jolley
(74) *Attorney, Agent, or Firm* — Pearne & Gordon LLP

(57) ABSTRACT

An adhesion layer formed of a thin film can be formed on a surface of a substrate. An adhesion layer forming method of forming the adhesion layer on the substrate includes supplying a coupling agent onto the substrate 2 while rotating the substrate 2. The substrate 2 is rotated at a low speed equal to or less than 300 rpm and the coupling agent diluted with IPA is supplied onto the substrate 2.

7 Claims, 5 Drawing Sheets

(51) Int. Cl.
    *C23C 18/38*          (2006.01)
    *C23C 18/50*          (2006.01)

(56) References Cited

U.S. PATENT DOCUMENTS

| | | | |
|---|---|---|---|
| 8,236,705 B2 * | 8/2012 | Parbhoo | B05D 1/002 118/111 |
| 2004/0235294 A1 | 11/2004 | Imori | |
| 2007/0190645 A1 * | 8/2007 | Miyake | A61L 27/3804 435/325 |
| 2009/0191720 A1 * | 7/2009 | Nakagawa | G03F 7/162 438/782 |
| 2010/0243461 A1 * | 9/2010 | Tsurumi | C23C 18/1608 205/125 |
| 2014/0071552 A1 * | 3/2014 | Uchiyama | G02B 1/115 359/885 |
| 2016/0167079 A1 * | 6/2016 | Hasimoto | G05B 15/02 700/283 |

FOREIGN PATENT DOCUMENTS

| | | |
|---|---|---|
| JP | 2010-184113 A | 8/2010 |
| JP | 2012-227317 A | 11/2012 |
| WO | 03/091476 A1 | 11/2003 |

\* cited by examiner

ADHESION LAYER FORMING METHOD, ADHESION LAYER FORMING SYSTEM AND RECORDING MEDIUM

CROSS-REFERENCE TO RELATED APPLICATION

This application claims the benefit of Japanese Patent Application 2015-064582 filed on Mar. 26, 2015, the entire disclosures of which are incorporated herein by reference.

TECHNICAL FIELD

The embodiments described herein pertain generally to an adhesion layer forming method and an adhesion layer forming system of forming an adhesion layer on a substrate, and a recording medium therefor.

BACKGROUND

Recently, semiconductor devices such as a LSI or the like have been required to have higher density in order to meet requirements for reducing the mounting space or for improving the processing rate. As an example of a technology that achieves the high density, there has been known a multilayer wiring technology of manufacturing a multilayer substrate, such as a three-dimensional LSI or the like, by stacking multiple wiring substrates.

According to the multilayer wiring technology, a silicon substrate is prepared, and an adhesion layer is formed on a recess of the silicon substrate or an insulating film, a silicon film and the like formed on the silicon substrate (substrate). A catalyst layer is formed on the adhesion layer, and copper (Cu), which is used as a conductive material, is buried in the recess. In this case, a Cu diffusion barrier film needs to be formed within the recess, and a seed film needs to be formed on the Cu diffusion barrier film by an electroless Cu plating method. Accordingly, a wiring volume of a wiring layer may be reduced or a void may be formed in the buried Cu. Meanwhile, there has been also proposed a method of burying, instead of Cu, a nickel (Ni)-based metal in the recess of the substrate by an electroless plating method and using the Ni-based metal as the wiring layer (electroless Ni plating layer).

The electroless Ni plating layer formed on the silicon substrate or on the insulating film, the silicon film and the like of the silicon substrate with the adhesion layer and the catalyst layer therebetween is silicided by being combined with silicon of the silicon substrate.

In this case, however, if the adhesion layer on the silicon substrate or on the insulating film, the silicon film and the like formed on the silicon substrate has an excessively large thickness, the silicidation of the Ni plating layer may not occur.

Patent Document 1: Japanese Patent Laid-open Publication No. 2010-184113

SUMMARY

In view of the foregoing, exemplary embodiments provide an adhesion layer forming method and an adhesion layer forming system in which an adhesion layer for forming a plating layer such as an electroless Ni plating layer is formed of a thin film having an appropriate thickness, on a silicon substrate or on an insulating film, a silicon film and the like formed on the silicon substrate, and a recording medium therefor.

In one exemplary embodiment, an adhesion layer forming method of forming an adhesion layer, for forming an electroless plating layer, on a substrate, includes preparing the substrate; and supplying a coupling agent onto the substrate while rotating the substrate. Further, in the supplying of the coupling agent, the coupling agent diluted with an organic solvent having hydrophilicity is supplied while maintaining the substrate in a wet state.

In another exemplary embodiment, an adhesion layer forming system of forming an adhesion layer on a substrate includes a substrate holding/rotating device configured to hold and rotate the substrate; and a coupling agent supplying unit configured to supply a coupling agent onto the substrate to form the adhesion layer on an entire surface of the substrate. Further, the coupling agent supplying unit is configured to supply the coupling agent diluted with an organic solvent having hydrophilicity.

In still another exemplary embodiment, there is a computer-readable recording medium having stored thereon computer-executable instructions that, in response to execution, cause an adhesion layer forming system to perform an adhesion layer forming method. Here, the adhesion layer forming method includes preparing a substrate; and supplying a coupling agent onto the substrate while rotating the substrate. Further, in the supplying of the coupling agent, the coupling agent diluted with an organic solvent having hydrophilicity is supplied while maintaining the substrate in a wet state.

According to the exemplary embodiments, it is possible to form an adhesion layer formed of a thin film having an appropriate thickness on a substrate in a uniform manner.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
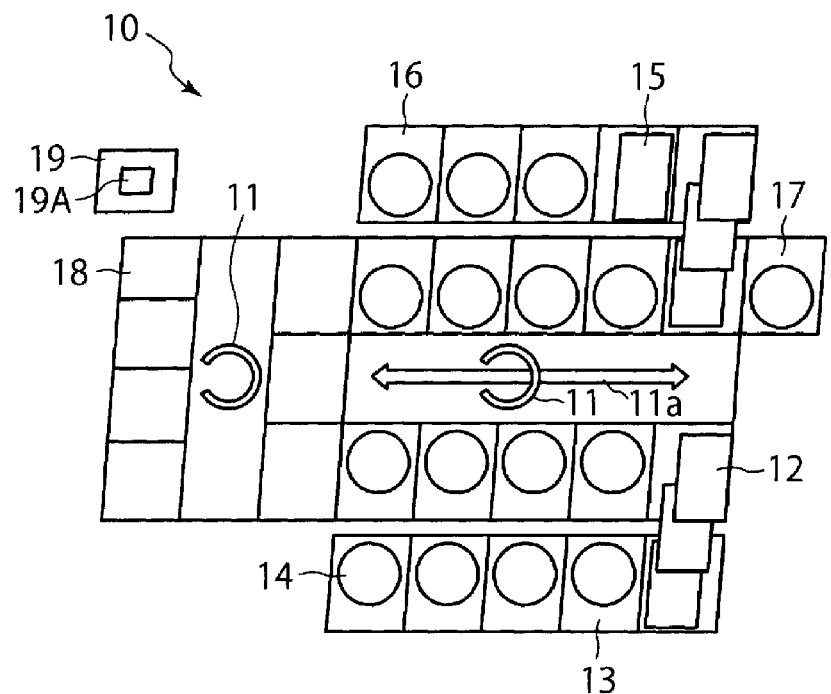
FIG. 1 is a block diagram illustrating an entire plating system equipped with an adhesion layer forming system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Plating System>

Referring to FIG. 1 to FIG. 7, an exemplary embodiment will be described.

First, a plating system equipped with an adhesion layer forming system according to the exemplary embodiment will be elaborated with reference to FIG. 1.

As depicted in FIG. 1, the plating system 10 is configured to perform a plating process on a substrate (silicon substrate or an insulating film, a silicon film and the like formed on the silicon substrate) 2, such as a semiconductor wafer, having a recess 2a (see FIG. 3A to FIG. 3F).

The plating system 10 includes a cassette station 18 configured to mount thereon a cassette (not shown) which accommodates the substrate 2 therein; a substrate transfer arm 11 configured to take out the substrate 2 from the cassette on the cassette station 18 and transfer the substrate 2; and a moving path 11a along which the substrate transfer arm 11 is moved.

Further, arranged at one side of the moving path 11a are an adhesion layer forming unit (adhesion layer forming system) 12 configured to form an adhesion layer 21 according to the exemplary embodiment by adsorbing a coupling agent such as a silane coupling agent onto the substrate 2; a catalyst layer forming unit 13 configured to form a catalyst layer 22 to be described later by adsorbing a catalyst onto the adhesion layer 21 of the substrate 2; and a plating layer forming unit 14 configured to form a plating layer 23, serving as a Cu diffusion barrier film to be described later, on the catalyst layer 22 of the substrate 2.

Further, arranged at the other side of the moving path 11a are a plating layer baking unit 15 configured to bake the plating layer 23 formed on the substrate 2; and an electroless Cu plating layer forming unit 16 configured to form an electroless copper plating layer (electroless Cu plating layer) 24, serving as a seed film to be described later, on the plating layer 23 formed on the substrate 2.

Further, an electrolytic Cu plating layer forming unit 17 configured to fill the recess 2a of the substrate 2 with an electrolytic copper plating layer (electrolytic Cu plating layer) 25 while using the electroless Cu plating layer 24 as a seed film is provided adjacent to the plating layer baking unit 15.

Further, the respective constituent components of the above-described plating system, for example, the cassette station 18, the substrate transfer arm 11, the adhesion layer forming unit (adhesion layer forming system) 12, the catalyst layer forming unit 13, the plating layer forming unit 14, the plating layer baking unit 15, the electroless Cu plating layer forming unit 16 and the electrolytic Cu plating layer forming unit 17 are controlled by a controller 19 according to various types of programs recorded in a recording medium 19A provided in the controller 19, so that various processes are performed on the substrate 2. Here, the recording medium 19A stores thereon various kinds of setup data or various kinds of programs such as a plating processing program to be described later. The recording medium 19A may be implemented by a computer-readable memory such as a ROM or a RAM, or a disk-type recording medium such as a hard disk, a CD-ROM, a DVD-ROM or a flexible disk, as commonly known in the art.

Now, the adhesion layer forming unit (adhesion layer forming system) 12 configured to form the adhesion layer 21 will be further elaborated.

Figure 5:
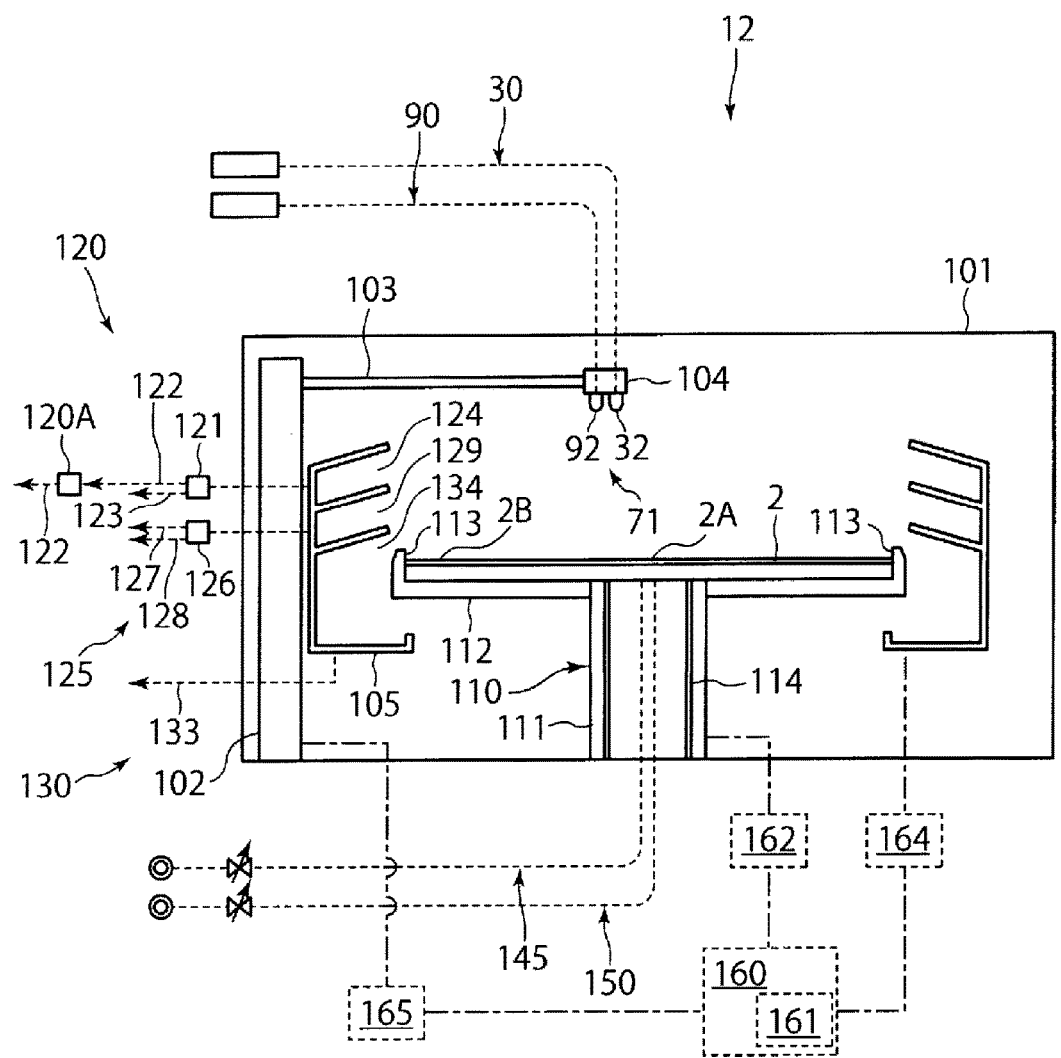
FIG. 5 is a side cross sectional view illustrating the adhesion layer forming system.
Figure 6:
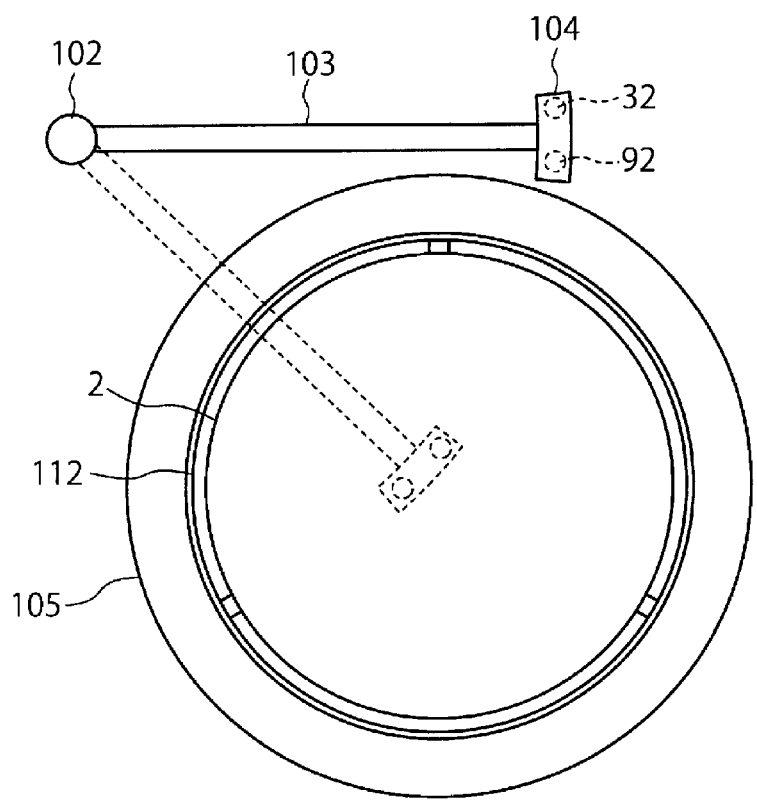
FIG. 6 is a plan view illustrating the adhesion layer forming system.

The adhesion layer forming unit 12 may be implemented by a liquid processing apparatus as illustrated in FIG. 5 and FIG. 6.

Further, each of the catalyst layer forming unit 13, the plating layer forming unit 14 and the electroless Cu plating layer forming unit 16 may also be implemented by the same liquid processing apparatus as the adhesion layer forming unit 12. The adhesion layer forming unit 12 is illustrated in FIG. 5 and FIG. 6.

The adhesion layer forming unit (adhesion layer forming system) 12 includes, as shown in FIG. 5 and FIG. 6, a substrate holding/rotating device (substrate accommodating unit) 110 configured to hold and rotate the substrate 2 within a casing 101; liquid supplying devices 30 and 90 configured to supply a coupling agent, a cleaning liquid or the like onto a surface of the substrate 2; a recovery cup 105 configured to collect the coupling agent, the cleaning liquid or the like dispersed from the substrate 2; draining openings 124, 129 and 134 configured to drain the coupling agent or the cleaning liquid collected by the recovery cup 105; liquid draining devices 120, 125 and 130 configured to drain the liquids collected in the draining openings; and a controller 160 configured to control the substrate holding/rotating device 110, the liquid supplying devices 30 and 90, the recovery cup 105 and the liquid draining devices 120, 125 and 130.

(Substrate Holding/Rotating Device)

The substrate holding/rotating device 110 includes, as illustrated in FIG. 5 and FIG. 6, a hollow cylindrical rotation shaft 111 vertically extended within the casing 101; a turntable 112 provided on an upper end portion of the rotation shaft 111; a wafer chuck 113 disposed on a peripheral portion of a top surface of the turntable 112 to support the substrate 2; and a rotating device 162 configured to rotate the rotation shaft 111. The rotating device 162 is controlled by the controller 160, and the rotation shaft 111 is rotated by the rotating device 162. As a result, the substrate 2 supported on the wafer chuck 113 is rotated.

Now, the liquid supplying devices 30 and 90 configured to supply a coupling agent, a cleaning liquid, or the like onto the surface of the substrate 2 will be explained with reference to FIG. 5 and FIG. 6. The liquid supplying device 30 is a coupling agent supplying device configured to supply a coupling agent such as a silane coupling agent onto the surface of the substrate 2. The liquid supplying device 90 is a cleaning liquid supplying device configured to supply a cleaning liquid onto the surface of the substrate 2.

Further, as depicted in FIG. 5 and FIG. 6, a nozzle head 104 is provided at a tip end portion of an arm 103, and this arm 103 is configured to be moved in a vertical direction. Further, the arm 103 is fastened to a supporting shaft 102 configured to be rotated by a rotating device 165. The nozzle head 104 is equipped with a nozzle 32 of the coupling agent supplying device 30 and a nozzle 92 of the cleaning liquid supplying device 90.

The cleaning liquid supplying device 90 includes the nozzle 92 which is provided at the nozzle head 104 as mentioned above. In this configuration, either a hydrophilic organic solvent (e.g., a cleaning liquid such as, but not limited to, isopropyl alcohol (IPA)) or a rinse liquid such as DIW is selectively discharged from the nozzle 92 onto the surface of the substrate 2.

(Liquid Draining Device)

Now, the liquid draining devices 120, 125 and 130 configured to drain out the coupling agent or the cleaning liquid dispersed from the substrate 2 will be elaborated with reference to FIG. 5. As shown in FIG. 5, the recovery cup 105, which can be moved up and down by an elevating device 164 and has the draining openings 124, 129 and 134, is disposed within the casing 101. The liquid draining devices 120, 125 and 130 are configured to drain out the liquids collected in the draining openings 124, 129 and 134, respectively.

As depicted in FIG. 5, the liquid draining devices 120 and 125, which are configured to drain out the coupling agent and the cleaning liquid, respectively, include collecting flow paths 122 and 127 and waste flow paths 123 and 128, which are switchably connected by flow path switching devices 121 and 126, respectively. Here, the coupling agent and the cleaning liquid are collected and reused through the collecting flow paths 122 and 127, respectively, and the coupling agent and the cleaning liquid are drained out through the waste flow paths 123 and 128, respectively. Further, as shown in FIG. 5, the liquid draining device 130 is only equipped with a waste flow path 133.

Further, as depicted in FIG. 5, the collecting flow path 122 of the liquid draining device 120 configured to drain the coupling agent is connected to an outlet side of the substrate accommodating unit 110, and a cooling buffer 120A configured to cool the coupling agent is provided at a portion of the collecting flow path 122 in the vicinity of the outlet side of the substrate accommodating unit 110.

Now, the plating layer baking unit 15 will be elaborated.

Figure 7:
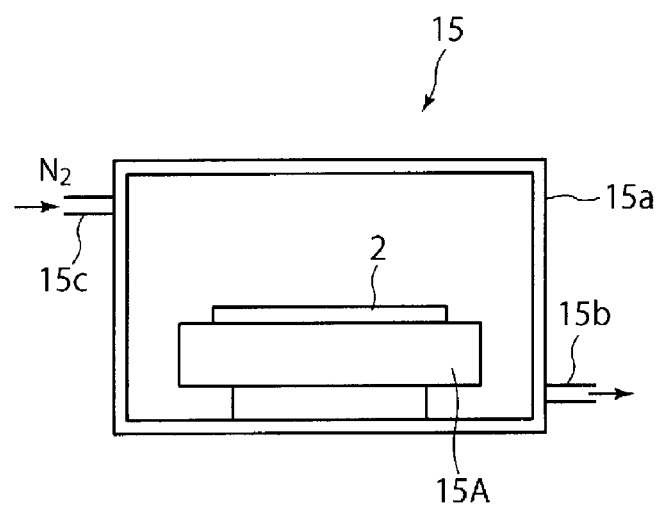
FIG. 7 is a side cross sectional view illustrating a plating layer baking unit.

The plating layer baking unit 15 includes, as illustrated in FIG. 7, an airtightly sealed casing 15a; and a hot plate 15A provided within the airtightly sealed casing 15a.

The airtightly sealed casing 15a of the plating layer baking unit 15 is provided with a transfer opening (not shown) through which the substrate 2 is transferred. An $N_2$ gas is supplied into the airtightly sealed casing 15a through an $N_2$ gas supply opening 15c.

Further, by evacuating the inside of the airtightly sealed casing 15a through an exhaust opening 15b and filling the inside of the airtightly sealed casing 15a with the $N_2$ gas, the inside of the airtightly sealed casing 15a can be maintained under an inert gas atmosphere.

<Plating Method>

Operations according to the exemplary embodiment having the above-described configuration will be explained with reference to FIG. 2 to FIG. 4.

First, in a pre-process, a recess 2a is formed on a substrate (a silicon substrate or an insulating film, a silicon film and the like formed on the silicon substrate) 2 such as a semiconductor wafer. The substrate 2 having thereon the recess 2a is then transferred into the plating system 10.

Here, as a method of forming the recess 2a on the substrate 2, a commonly known method in the art may be appropriately employed. Specifically, as a dry etching technique, for example, a general-purpose technique using a fluorine-based gas or a chlorine-based gas may be employed. Especially, in order to form a hole having a high aspect ratio (hole depth/hole diameter), a method using an ICP-RIE (Inductively Coupled Plasma Reactive Ion Etching) technique, which can perform a deep etching process with a high speed, may be more appropriately adopted. Especially, a Bosch process in which an etching process using sulfur hexafluoride ($SF_6$) and a protection process using a fluorine-based gas such as $C_4F_8$ are repeatedly performed may be appropriately utilized.

Figure 2:
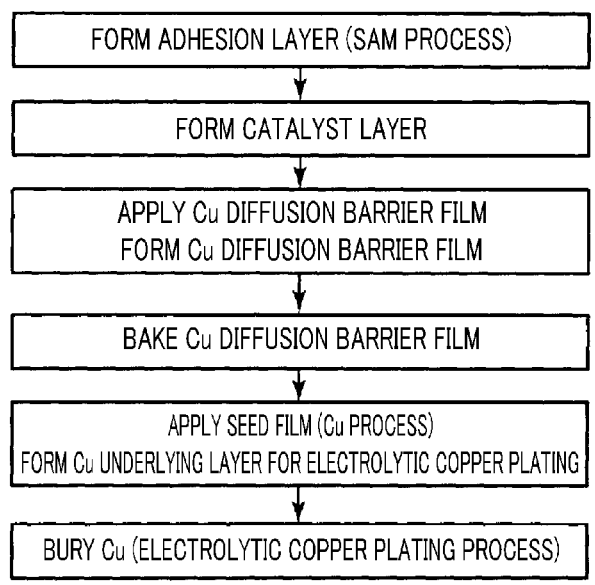
FIG. 2 is a flowchart for describing an overall plating method performed in the plating system according to the exemplary embodiment.
Figure 3A:
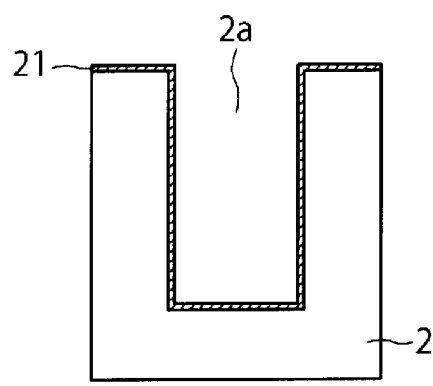
FIG. 3A to FIG. 3F are diagrams illustrating a substrate on which the plating method is performed.
Figure 3B:
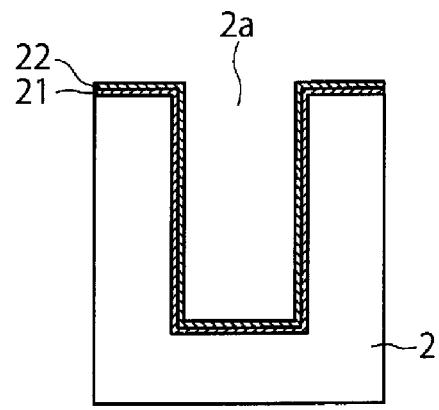

Subsequently, within the adhesion layer forming unit 12 of the plating system 10, an adhesion layer 21 is formed on the substrate 2 having the recess 2a (FIG. 2 and FIG. 3A). Specifically, within the adhesion layer forming unit 12, a coupling agent such as a silane coupling agent is adsorbed onto the substrate 2 having the recess 2a, so that the adhesion layer 21 is formed on the substrate 2 (SAM process). The adhesion layer 21 formed by adsorbing the silane coupling agent serves to improve adhesivity between the substrate 2 and a catalyst layer 22 to be described later.

Figure 4:
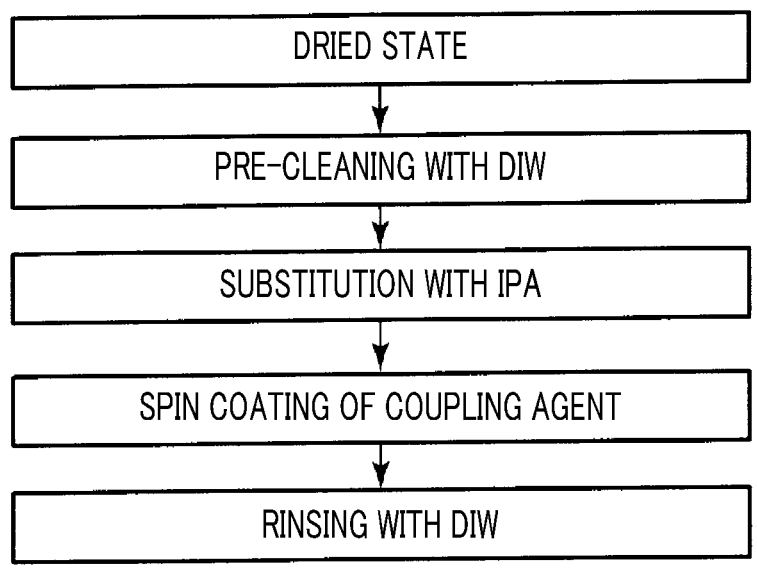
FIG. 4 is a process diagram illustrating an adhesion layer forming method according to the exemplary embodiment.

Now, the adhesion layer forming method performed in the adhesion layer forming unit 12 will be further elaborated with reference to FIG. 4.

First, the substrate 2 which is in a dry state is placed on the substrate holding/rotating device 110 of the adhesion layer forming unit 12. Then, as illustrated in FIG. 5, while the substrate 2 is rotated by the substrate holding/rotating device 110, DIW is supplied onto the substrate 2 from the nozzle 92 of the nozzle head 104, so that pre-cleaning is performed on the substrate 2 (pre-cleaning with DIW).

Then, while rotating the substrate 2, a liquid supplied from the nozzle 92 of the nozzle head 104 is changed, and, instead of the DIW, IPA having hydrophilicity is supplied onto the substrate 2 from the nozzle 92. Accordingly, the water remaining on the substrate 2 is substituted with the IPA (substitution with IPA).

Subsequently, while keeping on rotating the substrate 2, a silane coupling agent is supplied onto the substrate 2 from the nozzle 32 of the nozzle head 104. At this time, since the IPA from the nozzle 92 is continuously supplied, the silane coupling agent diluted with the IPA is supplied onto the substrate 2 while the substrate 2 is being rotated (spin coating of coupling agent).

In the spin coating of the silane coupling agent, the substrate 2 is rotated at a low speed equal to or less than 300 rpm by the substrate holding/rotating device 110. The silane coupling agent from the nozzle 32 is supplied onto the substrate 2 while being diluted by 10 times to 1000 times with the IPA supplied from the nozzle 92.

As stated above, since the substrate 2 is rotated at the low speed of 300 rpm or less and the silane coupling agent diluted with the IPA by 10 times to 1000 times is supplied onto the substrate 2, the silane coupling agent can be suppressed from being dispersed during the rotation and, thus, the substrate 2 can be suppressed from being dried. Furthermore, since the silane coupling agent is diluted with the IPA as described above, the adhesion layer 21 formed by adsorbing the silane coupling agent onto the substrate 2 can be suppressed from having an excessively large thickness. That is, the adhesion layer 21 made of a thin film having an appropriate thickness can be formed.

Moreover, by forming the adhesion layer 21 made of the thin film on the substrate 2, the adhesion layer 21 can securely adhere to the substrate. In addition, when forming a plating layer 23 made of a Ni or a Ni-based alloy on the adhesion layer 21 with a catalyst layer 22 therebetween as will be described later, since the adhesion layer 21 is formed of the thin film, the Ni or the Ni-based alloy of the plating layer 23 is allowed to react with the silicon substrate 2, so that silicidation of the Ni or the Ni-based alloy can be certainly performed.

Afterwards, while rotating the substrate 2, the supply of the silane coupling agent from the nozzle 32 is stopped, and the supply of the IPA from the nozzle 92 is also stopped. Thereafter, DIW is supplied onto the substrate 2 from the nozzle 92, and the silane coupling agent remaining on the substrate 2 is removed (rinsing with DIW).

As described above, the coupling agent is supplied from the nozzle 32 of the coupling agent supplying device 30, and this coupling agent is diluted with the IPA which is supplied from the nozzle 92 of the cleaning liquid supplying device 90. Thus, the coupling agent supplying device 30 configured to supply the coupling agent and the cleaning liquid supplying device 90 configured to supply the cleaning liquid constitute a coupling agent supplying unit configured to supply the coupling agent diluted with the IPA.

The substrate 2, on which the adhesion layer 21 is formed in the adhesion layer forming unit 12, is then transferred by the substrate transfer arm 11 into the catalyst layer forming unit 13. In the catalyst layer forming unit 13, a catalyst solution containing, for example, nano-palladium serving as a catalyst is supplied onto the adhesion layer 21 of the substrate 2, and the nano-palladium is adsorbed on the adhesion layer 21, so that the catalyst layer 22 is formed (see FIG. 3B). In this case, the catalyst layer forming unit 13 may be implemented by the liquid processing apparatus as illustrated in FIG. 5 and FIG. 6.

Next, the catalyst solution supplied onto the substrate 2 and the catalyst contained in the catalyst solution will be explained. First, the catalyst will be elaborated.

As the catalyst adsorbed onto the adhesion layer 21 of the substrate 2, a catalyst having catalysis to accelerate a plating reaction may be appropriately used. By way of example, a catalyst formed of nanoparticles may be used. Here, the nanoparticle means a colloid particle that has catalysis and has an average particle diameter equal to or smaller than 20 nm, e.g., within the range from 0.5 nm to 20 nm. An element constituting the nanoparticles may include, by way of example, but not limitation, palladium, gold, platinum, or the like. Among these, the palladium of nanoparticle may be represented as n-Pd.

Further, as the element constituting the nanoparticles, ruthenium may be used.

A method of measuring the average particle diameter of the nanoparticles is not particularly limited, and various methods may be adopted. By way of example, when measuring the average particle diameter of the nanoparticles in the catalyst solution, a dynamic light scattering method may be employed. In the dynamic light scattering method, a laser beam is irradiated to the nanoparticles dispersed in the catalyst solution, and the average particle diameter of the nanoparticles is calculated by measuring scattered light.

Further, to measure the average particle diameter of the nanoparticles adsorbed on the recess 2a of the substrate 2, a preset number of nanoparticles, for example, twenty nanoparticles may be detected from an image which is obtained by using a TEM (Transmission Electron Microscope) or a SEM (Scanning Electron Microscope), and the average particle diameter of these nanoparticles may be calculated.

Now, the catalyst solution containing the catalyst formed of the nanoparticles will be elaborated. The catalyst solution contains ions of a metal constituting the nanoparticles serving as the catalyst. For example, if palladium constitutes the nanoparticles, the catalyst solution contains a palladium compound, such as palladium chloride, as a palladium ion source.

A specific composition of the catalyst solution is not particularly limited. Desirably, however, the composition of the catalyst solution is set such that the catalyst solution has a viscosity coefficient equal to or less than 0.01 Pa·s. By setting the viscosity coefficient of the catalyst solution to be in this range, the catalyst solution can be sufficiently diffused down up to a bottom portion of the recess 2a of the substrate 2, even if a diameter of the recess 2a of the substrate 2 is small. Accordingly, the catalyst can be securely adsorbed to the bottom portion of the recess 2a of the substrate 2 as well more securely.

Desirably, the catalyst in the catalyst solution is coated with a dispersant. Accordingly, surface energy of the catalyst can be reduced. As a result, it is assumed that the diffusion of the catalyst within the catalyst solution can be more accelerated, so that the catalyst can reach the bottom portion of the recess 2a of the substrate 2 in a shorter time period. Furthermore, it is assumed that an increase in the diameter of the catalyst that might be caused by agglomeration of multiple catalysts can be suppressed, so that the diffusion of the catalyst in the catalyst solution can be further accelerated.

A method for preparing the catalyst coated with the dispersant is not particularly limited. By way of example, a catalyst solution containing the catalyst which is previously coated with the dispersant may be supplied to the catalyst layer forming unit 13. Alternatively, the catalyst layer forming unit 13 may be configured to perform a process of coating the catalyst with the dispersant within the catalyst layer forming unit 13.

Specifically, it is desirable to use polyvinylpyrrolidone (PVP), polyacrylic acid (PAA), polyethyleneimine (PEI), tetramethylammonium (TMA), citric acid, or the like as the dispersant.

Besides, various chemical materials for controlling the characteristic may be added into the catalyst solution.

Furthermore, the catalyst solution containing the catalyst may not be limited to the catalyst solution containing the nanoparticles such as nano-palladium. By way of example, an aqueous solution containing palladium ions, which is represented by an aqueous solution of palladium chloride or an aqueous solution of palladium hydroxide, which is obtained by adjusting a pH, may be used as the catalyst solution. Further, the palladium ions in the aqueous solution of palladium chloride may be used as the catalyst.

After the catalyst layer 22 is formed on the substrate 2 in the catalyst layer forming unit 13 as stated above, the substrate 2 is then transferred into the plating layer forming unit 14 by the substrate transfer arm 11.

Figure 3C:
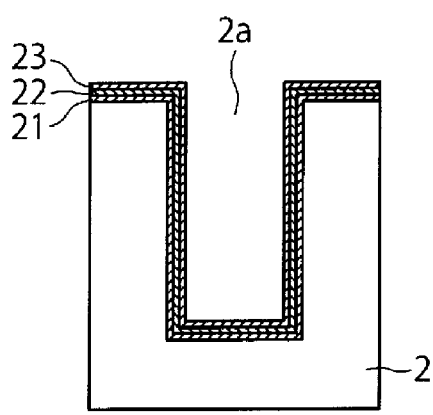

Subsequently, in the plating layer forming unit 14, a plating layer 23 serving as a Cu diffusion barrier film is formed on the catalyst layer 22 of the substrate 2 (see FIG. 3C).

In this case, the plating layer forming unit 14 is configured as the liquid processing apparatus as illustrated in FIG. 5 and FIG. 6. The plating layer 23 can be formed by performing an electroless plating process on the catalyst layer 22 of the substrate 2.

When forming the plating layer 23 in the plating layer forming unit 14, a plating liquid containing, for example, Ni or a Ni-based alloy may be used, and a temperature of the plating liquid is maintained at 40° C. to 75° C.

By supplying the plating liquid onto the substrate 2, the plating layer 23 containing the Ni or the Ni-based alloy is formed on the catalyst layer 22 of the substrate 2 through the electroless plating process.

Thereafter, the substrate 2 having the plating layer 23 formed on the catalyst layer 22 thereof is transferred from the plating layer forming unit 14 into the airtightly sealed casing 15a of the plating layer baking unit 15 by the substrate transfer arm 11.

Within the airtightly sealed casing 15a of the plating layer baking unit 15, the substrate 2 is heated on the hot plate 15A under an inert gas atmosphere where a $N_2$ gas is filled, in order to suppress the substrate 2 from being oxidized. Accordingly, the plating layer 23 of the substrate 2 is baked.

When baking the plating layer 23 in the plating layer baking unit 15, a baking temperature may be set to be in the range from, e.g., 150° C. to 200° C., and a baking time is set to be in the range from, e.g., 10 minutes to 30 minutes.

By baking the plating layer 23 on the substrate 2 as described above, moisture within the plating layer 23 can be removed, and, at the same time, the bond between metals within the plating layer 23 can be enhanced.

The plating layer 23 formed as described above serves as the Cu diffusion barrier layer. The substrate 2, on which the plating layer 23 serving as the Cu diffusion barrier layer is formed, is then sent to the electroless Cu plating layer forming unit 16 by the substrate transfer arm 11.

Figure 3D:
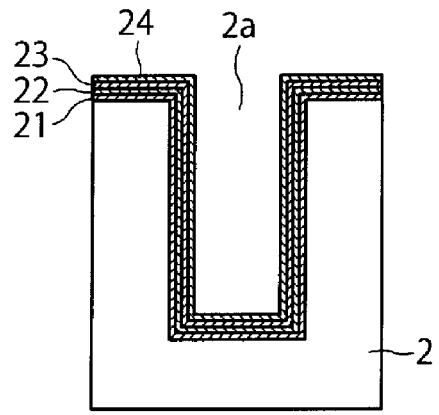
Figure 3E:
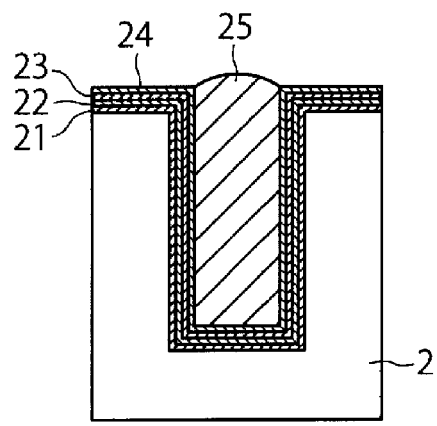

Subsequently, in the electroless Cu plating layer forming unit 16, an electroless Cu plating layer 24 serving as a seed film for forming an electrolytic Cu plating layer 25 is formed on the plating layer 23 of the substrate 2 (see FIG. 3D).

Here, the electroless Cu plating layer forming unit 16 is configured as the liquid processing apparatus as illustrated in FIG. 5 and FIG. 6. By performing the electroless plating process on the plating layer 23 of the substrate 2, the electroless Cu plating layer 24 can be formed.

The electroless Cu plating layer 24 formed in the electroless Cu plating layer forming unit 16 serves as the seed film for forming the electrolytic Cu plating layer 25. A plating liquid used in the electroless Cu plating layer forming unit 16 may contain a copper salt as a source of copper ions, such as copper sulfate, copper nitrate, copper chloride, copper bromide, copper oxide, copper hydroxide, copper pyrophosphate, or the like. The plating liquid may further contain a reducing agent and a complexing agent for the copper ions. Further, the plating liquid may further contain various kinds of additives for improving stability or speed of the plating reaction.

The substrate 2 having the electroless Cu plating layer 24 formed thereon is sent to the electrolytic Cu plating layer forming unit 17 by the substrate transfer arm 11. Here, the substrate 2 having the electroless Cu plating layer 24 formed thereon may be sent to the electrolytic Cu plating layer forming unit 17 after sent to and baked in the plating layer baking unit 15. Subsequently, in the electrolytic Cu plating layer forming unit 17, an electrolytic Cu plating process is performed on the substrate 2, so that an electrolytic Cu plating layer 25 is filled within the recess 2a of the substrate 2 by using the electroless Cu plating layer 24 as the seed film (see FIG. 3E).

Figure 3F:
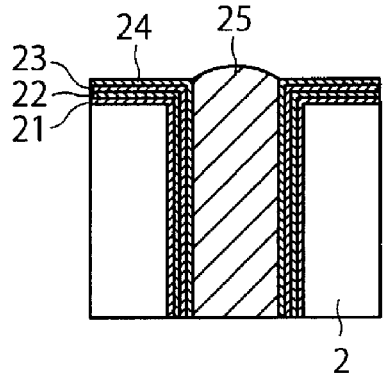

Thereafter, the substrate 2 is taken out of the plating system 10, and a rear surface side (opposite side from where the recess 2a is formed) of the substrate 2 is polished by the chemical mechanical polishing (see FIG. 3F).

According to the exemplary embodiment, in the adhesion layer forming unit 12, while rotating the substrate 2 at the low speed equal to or less than 300 rpm, the silane coupling agent diluted by 10 times to 1000 times with the IPA can be supplied onto the substrate 2. Therefore, the adhesion layer 21 formed of a thin film having an appropriate thickness can be formed on the substrate 2. Accordingly, the silicidation of the plating layer formed of the Ni or the Ni-alloy on the adhesion layer 21 can be readily accomplished.

Modification Examples of Exemplary Embodiment

Now, a modification example of the present exemplary embodiment will be described. In the above-described exemplary embodiment, the plating layer 23 formed of the Ni or the Ni-alloy is formed on the adhesion layer 21 with the catalyst layer 22 therebetween. However, it is also possible to form the plating layer 23 containing Co—W—B instead of the Ni or the Ni-based alloy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An adhesion layer forming method of forming an adhesion layer, for forming an electroless plating layer, on a substrate, comprising:
preparing the substrate; and
supplying an organic solvent having hydrophilicity from a first nozzle of a common nozzle head onto the substrate while rotating the substrate; and
then supplying a coupling agent from a second nozzle of the common nozzle head onto the substrate while rotating the substrate and continuously supplying the organic solvent from the first nozzle onto the substrate,
wherein, in the supplying of the coupling agent, the coupling agent is being diluted with the organic solvent that is being supplied onto the substrate while maintaining the substrate in a wet state, and
the first nozzle and the second nozzle are adjacently provided to the common nozzle head to supply different solutions toward the substrate.

2. The adhesion layer forming method of claim 1, wherein, in the supplying of the coupling agent, the substrate is rotated at a rotational number equal to or less than 300 rpm.

3. The adhesion layer forming method of claim 1, wherein the coupling agent is diluted with isopropyl alcohol.

4. The adhesion layer forming method of claim 3, wherein the coupling agent is diluted with the isopropyl alcohol by 10 times to 1000 times.

5. The adhesion layer forming method of claim 1, wherein before the supplying of the coupling agent, the substrate is previously maintained in the wet state by the organic solvent having hydrophilicity.

6. The adhesion layer forming method of claim 1, wherein after the supplying of the coupling agent, a rinse process is performed on the substrate to remove the coupling agent remaining on the substrate.

7. A non-transitory computer-readable recording medium having stored thereon computer-executable instructions that, in response to execution, cause an adhesion layer forming system to perform an adhesion layer forming method, wherein the adhesion layer forming method comprises:
preparing a substrate;

supplying an organic solvent having hydrophilicity from a first nozzle of a common nozzle head onto the substrate while rotating the substrate; and supplying a coupling agent from a second nozzle of the common nozzle head onto the substrate while rotating the substrate and continuously supplying the organic solvent from the first nozzle onto the substrate, wherein, in the supplying of the coupling agent, the coupling agent is being diluted with the organic solvent having hydrophilicity that is being supplied onto the substrate while maintaining the substrate in a wet state, and the first nozzle and the second nozzle are adjacently provided to the common nozzle head to supply different solutions toward the substrate.

* * * * *